US009257192B2

(12) United States Patent
Lee et al.

(10) Patent No.: US 9,257,192 B2
(45) Date of Patent: Feb. 9, 2016

(54) MEMORY SYSTEM PERFORMING MULTI-STEP ERASE OPERATION BASED ON STORED METADATA

(71) Applicants: Joon-Ho Lee, Hwaseong-Si (KR);
Jong-Nam Baek, Hwaseong-Si (KR);
Dong-Hoon Ham, Hwaseong-Si (KR);
Sang-Wook Yoo, Seongnam-Si (KR);
In-Tae Hwang, Suwon-Si (KR)

(72) Inventors: Joon-Ho Lee, Hwaseong-Si (KR);
Jong-Nam Baek, Hwaseong-Si (KR);
Dong-Hoon Ham, Hwaseong-Si (KR);
Sang-Wook Yoo, Seongnam-Si (KR);
In-Tae Hwang, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 65 days.

(21) Appl. No.: 14/172,941

(22) Filed: Feb. 5, 2014

(65) Prior Publication Data
US 2014/0226404 A1 Aug. 14, 2014

(30) Foreign Application Priority Data

Feb. 12, 2013 (KR) ........................ 10-2013-0014987

(51) Int. Cl.
*G11C 16/04* (2006.01)
*G11C 16/16* (2006.01)
*G11C 16/08* (2006.01)
*G11C 16/34* (2006.01)

(52) U.S. Cl.
CPC ............... *G11C 16/16* (2013.01); *G11C 16/04* (2013.01); *G11C 16/0483* (2013.01); *G11C 16/08* (2013.01); *G11C 16/344* (2013.01)

(58) Field of Classification Search
CPC ........ G11C 16/04; G11C 16/08; G11C 16/10; G11C 16/16; G11C 16/3445; G11C 1/04836
USPC ............. 365/185.11, 185.12, 185.22, 185.23, 365/185.29
See application file for complete search history.

(56) References Cited

U.S. PATENT DOCUMENTS

| 5,978,273 | A |  | 11/1999 | Shigemura |  |
| 6,513,095 | B1 |  | 1/2003 | Tomori |  |
| 7,161,835 | B2 |  | 1/2007 | Shiga |  |
| 8,566,505 | B2 | * | 10/2013 | Kilzer et al. | 711/103 |
| 8,595,415 | B2 | * | 11/2013 | Van Aken et al. | 711/103 |
| 8,898,371 | B2 | * | 11/2014 | Reiter et al. | 711/103 |
| 2008/0282024 | A1 |  | 11/2008 | Biswas et al. |  |
| 2011/0072198 | A1 | * | 3/2011 | Reiter et al. | 711/103 |
| 2011/0145483 | A1 |  | 6/2011 | Sudo |  |
| 2013/0019051 | A1 | * | 1/2013 | Somanache et al. | 711/103 |

FOREIGN PATENT DOCUMENTS

| JP | 10-040175 | 2/1998 |
| JP | 2003-122646 | 4/2003 |
| JP | 2004-118937 | 4/2004 |
| JP | 2005-025401 | 1/2005 |
| JP | 2008-181661 | 8/2008 |
| KR | 10-0593652 A | 11/2001 |

* cited by examiner

*Primary Examiner* — Gene Auduong
(74) *Attorney, Agent, or Firm* — Volentine & Whitt, PLLC

(57) ABSTRACT

A memory system, including a flash memory including multiple memory blocks, and a controller configured to erase each of the memory blocks using multiple steps. The controller stores, for each of the memory blocks, metadata indicating which of the multiple steps have been completed, and erases each of the memory blocks based on the stored metadata.

18 Claims, 11 Drawing Sheets

MEMORY SYSTEM PERFORMING MULTI-STEP ERASE OPERATION BASED ON STORED METADATA

CROSS-REFERENCE TO RELATED APPLICATION

This application claims priority under 35 USC §119 to Korean Patent Application No. 10-2013-0014987 filed on Feb. 12, 2013, the subject matter of which is hereby incorporated by reference.

BACKGROUND OF THE INVENTION

The inventive concept relates generally to electronic memory technologies. More particularly, certain embodiments of the inventive concept relate to memory systems and related methods of operation in which memory cells are erased by a multi-step process based on stored metadata.

Memory devices may be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include static random access memory (SRAM) devices, dynamic random access memory (DRAM) devices, and synchronous DRAM (SDRAM) devices. Examples of nonvolatile memory devices include flash memory devices, read only memory (ROM) devices, programmable ROM (PROM) devices, electrically erasable and programmable ROM (EEPROM) devices, and various forms of resistive memory such as phase-change RAM (PRAM), ferroelectric RAM (FRAM), and resistive RAM (RRAM).

In certain types of flash memory devices, such as vertical NAND (VNAND) flash memory devices using charge trapped flash (CTF) cells, erase operations may take a relatively long time and can therefore affect overall system performance. Consequently, there is a general need to improve systems to cope with or reduce this relatively long erase time.

SUMMARY OF THE INVENTION

In one embodiment of the inventive concept, a memory system comprises a flash memory comprising multiple memory blocks, and a controller configured to erase each of the memory blocks using multiple steps. The controller stores, for each of the memory blocks, metadata indicating which of the multiple steps have been completed, and erases each of the memory blocks based on the stored metadata.

In another embodiment of the inventive concept, a memory system comprises a flash memory comprising multiple memory blocks, and a controller configured to erase each of the memory blocks using multiple steps. The controller stores, for each of the memory blocks, metadata indicating which of the multiple steps have been completed, and erases each of the memory blocks based on the stored metadata.

In another embodiment of the inventive concept, a method is provided for operating a memory system comprising a flash memory having multiple memory blocks, and a controller configured to erase each of the memory blocks using multiple steps. The method comprises the controller storing in the flash memory, metadata indicating for each of the memory blocks which of the multiple steps have been completed, and the controller erasing one or more of the memory blocks based on the stored metadata.

These and other embodiments of the inventive concept can potentially improve the performance of certain memory systems and devices by hiding certain latencies that may be associated with erase operations.

BRIEF DESCRIPTION OF THE DRAWINGS

The drawings illustrate selected embodiments of the inventive concept. In the drawings, like reference numbers indicate like features.

DETAILED DESCRIPTION

Figure 1:
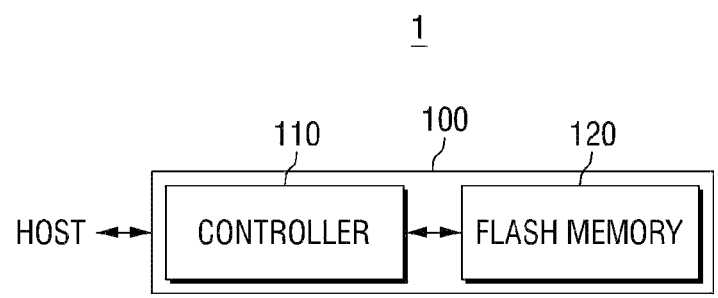
FIG. 1 is a block diagram illustrating a memory system, according to an embodiment of the inventive concept.

Embodiments of the inventive concept are described below with reference to the accompanying drawings. These embodiments are presented as teaching examples and should not be construed to limit the scope of the inventive concept.

In the description that follows, where a feature is referred to as being "on" another feature, it can be directly on the other feature, or intervening features may also be present. In contrast, where a feature is referred to as being "directly on" another feature, there are no intervening features present.

Spatially relative terms, such as "beneath," "below," "lower," "above," "upper" and the like, may be used herein for ease of description to describe various relationships between different features as shown in the drawings. The spatially relative terms are intended to encompass different orientations of the device in use or operation in addition to the orientation depicted in the drawings. For example, if the device in the drawings is turned over, features described as "below" or "beneath" other features would then be oriented "above" the other features. Thus, the term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents are to be construed to cover both the singular and the plural, unless otherwise indicated herein or clearly contradicted by context. Terms such as "comprising," "having," "including," and "containing" are to be construed as open-ended terms unless otherwise noted.

Unless defined otherwise, all technical and scientific terms used herein have the same meaning as commonly understood by one of ordinary skill in the art. It is noted that the use of any and all examples or terms herein is intended merely to better illuminate the inventive concept and is not a limitation on the scope of the inventive concept unless otherwise specified. Further, unless expressly indicated herein, terms such as those defined in generally used dictionaries should not be interpreted in an overly formal manner.

The inventive concept will be described with reference to perspective views, cross-sectional views, and/or plan views. Thus, the shape of actual devices may vary from those views, e.g., because of manufacturing tolerances, design choices, or other factors.

Figure 2:
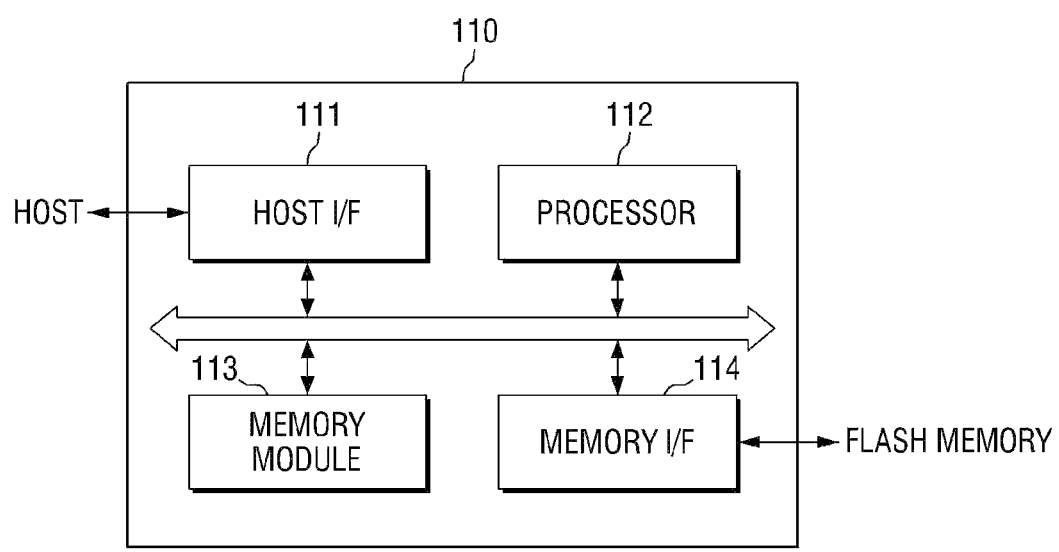
FIG. 2 is a block diagram illustrating a controller of a storage device shown in FIG. 1, according to an embodiment of the inventive concept.

FIG. 1 is a block diagram illustrating a memory system according to an embodiment of the inventive concept, and FIG. 2 is a block diagram illustrating a controller of a storage device shown in FIG. 1, according to an embodiment of the inventive concept.

Referring to FIG. 1, memory system 1 comprises a host and a storage device 100. Storage device 100 comprises a flash memory 120 storing data and a controller 110 controlling flash memory 120.

Controller 110 is connected to the host and flash memory 120. Controller 110 accesses flash memory 120 upon request from the host. Controller 110 may control read, write, erase, and background operations of flash memory 120, for example. Controller 110 provides an interface between flash memory 120 and the host. Controller 110 typically drives firmware to control flash memory 120. Controller 110 transmits a signal indicating the state of flash memory 120 to the host, for example, a ready signal or a busy signal while driving flash memory 120. Where controller 110 receives from the host a write command or a read command, controller 110 transmits a busy signal to the host to indicate that flash memory 120 is busy, while a write or read operation on flash memory 120. After the write or read operation is completed, controller 110 transmits a ready signal to the host to indicate that flash memory 120 is ready.

Flash memory 120 comprises memory cells to which data is written. Flash memory 120 may be, for example, a single level cell (SLC) memory in which one bit data is written to one memory cell, or a multi level cell (MLC) memory in which multiple bits of data are written to one memory cell. For example, flash memory 120 may be a NAND flash memory 120 or a vertical NAND flash memory 120 comprising a charge trapped flash (CTF) cell.

Referring to FIG. 2, controller 110 comprises a host interface (I/F) 111, a memory interface (I/F) 114, a memory module 113, and a processor 112.

Host I/F 111 implements a protocol to exchange data between controller 110 and an external device, assumed to be the host for explanation purposes. Controller 110 may be configured to communicate with the external device through one of various standard interface protocols such as universal serial bus (USB), multimedia card (MMC), peripheral component interconnection (PCI) protocol, PCI-express (PCI-E) protocol, advanced technology electronics (ATA) protocol, serial-ATA protocol, parallel-ATA protocol, small computer small interface (SCSI) protocol, enhanced small disk interface (ESDI) protocol, and integrated drive electronics (IDE) protocol.

Memory I/F 114 interfaces with flash memory 120. Memory I/F 114 may comprise, for example, a NAND interface. Memory module 113 may be used as at least one of an operating memory of processor 112, a cache memory between flash memory 120 and the host, and a buffer memory between flash memory 120 and the host. Memory module 113 may temporarily store data to be written to flash memory 120 or data read from flash memory 120. Memory module 113 may be, for example, an SRAM, although the inventive concept is not limited thereto. Processor 112 controls operations of controller 110.

Although not shown in FIGS. 1 and 2, controller 110 may further comprise an error correction block for detecting and/or correcting errors in data read from flash memory 120 using error correction codes (ECCs). As an example, the error correction block may be provided as a component of controller 110. Alternatively or additionally, an error correction block may be provided as a component of flash memory 120.

Flash memory 120 comprises a memory array. The memory array may have a two-dimensional array structure or a three-dimensional array structure. The memory array typically comprises multiple blocks each comprising multiple pages. Each of the pages may be temporarily characterized as a free page, a valid page, or an invalid page.

Controller 110 manages blocks of the memory array using virtual addresses. As an example, virtual addresses may be allocated to the corresponding blocks of the memory array. The virtual address allocated to each block may be referred to as a virtual block address. Controller 110 manages the block by mapping an externally supplied logical block address and the virtual block address. The mapping of the logical block address to the virtual block address may be managed through firmware of controller 110, for example, a flash translation layer (FTL). The FTL may perform background operations, such as wear leveling or garbage collection, for example.

Controller 110 manages pages of the memory array using the virtual address. Virtual addresses corresponding to the pages of the block may be allocated to the pages.

Figure 3:
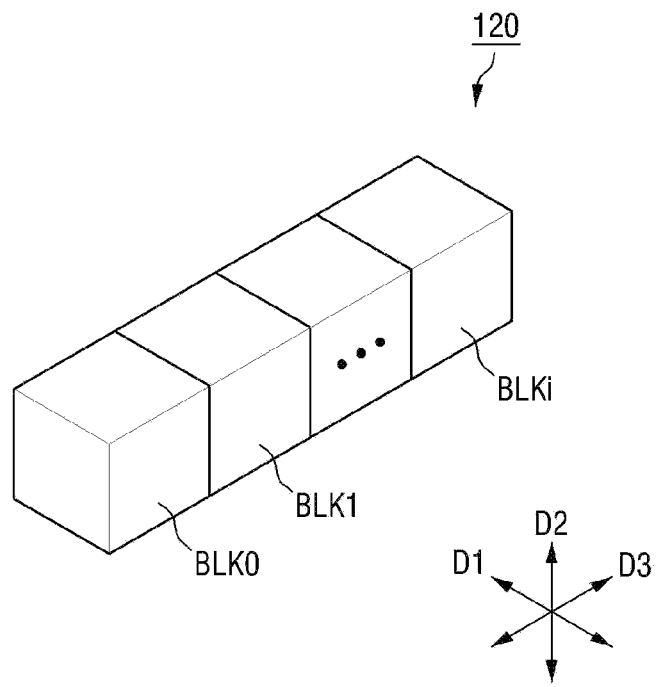
FIG. 3 is a diagram illustrating a flash memory in the memory system of FIG. 1, according to an embodiment of the inventive concept.
Figure 4:
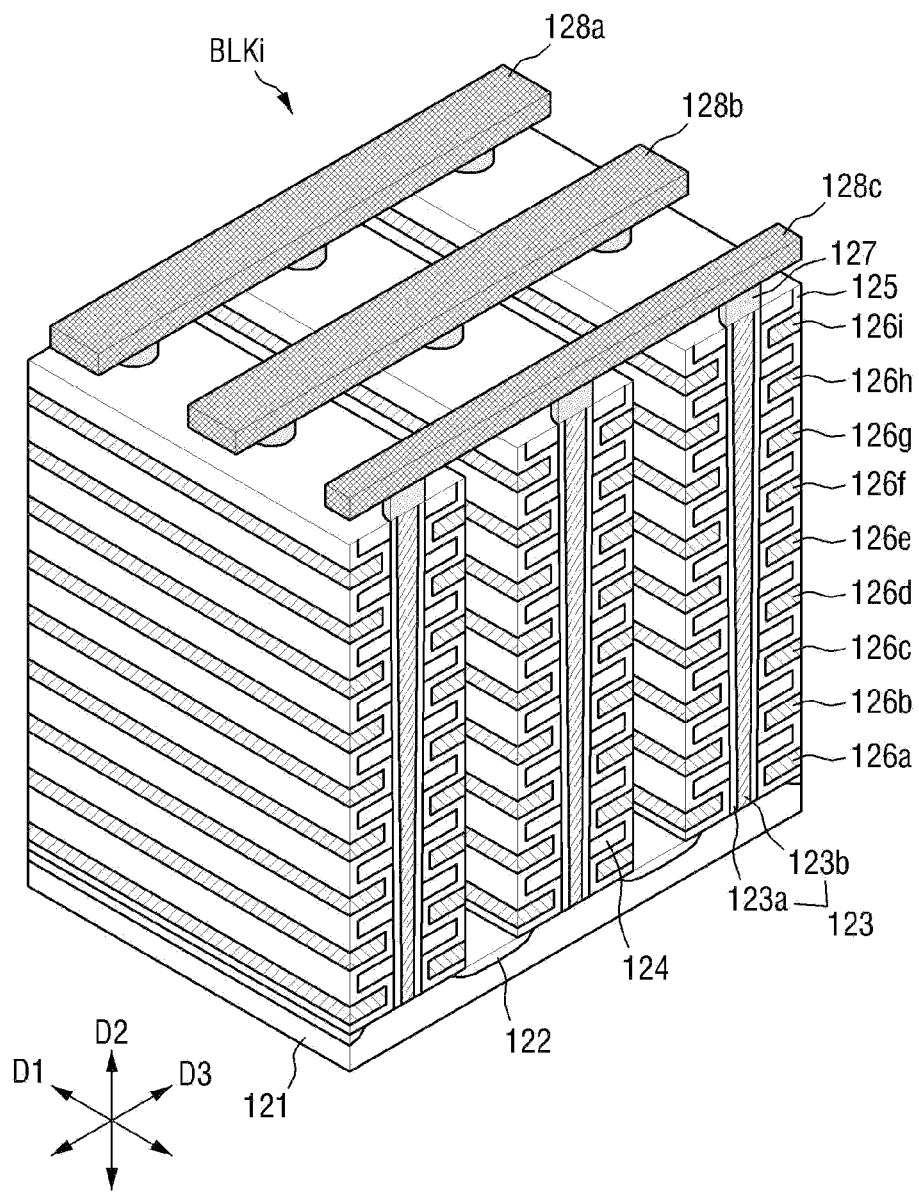
FIG. 4 is a perspective view illustrating memory blocks in the flash memory of FIG. 3, according to an embodiment of the inventive concept.

FIG. 3 is a diagram illustrating flash memory 120 of FIG. 1, according to an embodiment of the inventive concept. FIG. 4 is a perspective view illustrating memory blocks shown in FIG. 3, according to an embodiment of the inventive concept.

Referring to FIG. 3, a memory cell array of flash memory 120 comprises multiple memory blocks BLK0 to BLKi. The respective memory blocks BLK0 to BLKi extend in first to third directions D1, D2 and D3, which cross each other as shown in FIG. 3. The first to third directions D1, D2 and D3 may cross each other at right angle, although the inventive concept is not limited thereto.

Referring to FIG. 4, a memory block BLKi comprises multiple intermediate wiring structures 123, multiple interlayer insulating layers 124, multiple gate patterns 126a to 126i, a block layer 125, and multiple bit lines 128a to 128c, which are formed on a substrate 121.

Multiple doped regions 122 are provided on substrate 121. Interlayer insulating layers 124, which are spaced apart from each other in second direction D2, may be sequentially stacked. As shown in FIG. 4, each of interlayer insulating layers 124 may be formed to elongate in first direction D1. Interlayer insulating layers 124 may be made of oxide, although the inventive concept is not limited thereto.

Each of intermediate wiring structures 123 comprises an information storage pattern 123a, and channel patterns 123b. Flash memory cells are disposed at intersections between channel patterns 123b and gate patterns 126a to 126i.

Channel patterns 123b are formed to elongate in second direction D2, and gate patterns 126a to 126i are formed to elongate in first direction D1. Channel patterns 123b are arranged on substrate 121 in forms of pillars and are formed to pass through the stacked interlayer insulating layers 124. Gate patterns 126a to 126i are formed between each of the stacked interlayer insulating layers 124 and are spaced apart from channel patterns 123b. Gate patterns 126a to 126i cross channel patterns 123b. In the illustrated embodiment, gate patterns 126a to 126i have the same thickness. However, gate patterns 126a to 126i may have different thicknesses from each other.

Channel patterns 123b may comprise, for example, a semiconductor material, such as single crystalline silicon, but the inventive concept is not limited thereto. Gate patterns 126a to 126i may include, for example, a conductive material, such as tungsten (W), cobalt (Co) or nickel (Ni), or a semiconductor material, such as silicon, although the inventive concept is not limited thereto.

An information storage pattern 123a is formed on sidewalls of channel patterns 123b. Information storage pattern 123a may be a stack of a tunnel layer and a trap layer. The tunnel layer and the trap layer may be disposed between gate patterns 126a to 126i and channel patterns 123b. In detail, the tunnel layer and the trap layer may be formed along channel patterns 123b to pass through interlayer insulating layers 124.

The tunnel layer, which is a region through which charges pass, may be formed of, for example, a silicon oxide layer, or may have a double layered structure including a silicon oxide and a silicon nitride layer. The trap layer, which is a region in which the charges having passed through the tunnel layer are stored, may be formed of, for example, a nitride layer or a high-k layer. The nitride layer may include, for example, at least one of silicon nitride, silicon oxynitride, hafnium oxynitride, zirconium oxynitride, hafnium silicon oxynitride, and hafnium aluminum oxynitride. The high-k layer may include, for example, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Block layer 125 is disposed between channel patterns 123b and gate patterns 126a to 126i. Block layer 125 elongates in first direction D1. In addition, block layer 125 may be formed to have a zigzag configuration in second direction D2.

Block layer 125 is formed between the upper interlayer insulating layer 124 and each of gate patterns 126a to 126i, between the lower interlayer insulating layer 124 and each of gate patterns 126a to 126i, and between channel patterns 123b (or the trap layer) and each of gate patterns 126a to 126i. That is to say, block layer 125 may be conformally formed along interlayer insulating layer 124 and channel patterns 123b.

Block layer 125 may comprise a single layer or a multiple layers. Block layer 125 may comprise a silicon oxide or an insulating metal oxide having a larger dielectric constant than silicon oxide. For example, block layer 125 may comprise a high-k material, such as aluminum oxide, hafnium oxide, lanthanum oxide, tantalum oxide, titanium oxide, lanthanum hafnium oxide, lanthanum aluminum oxide, or dysprosium scandium oxide, or a combination layer of a stack of these materials. In the illustrated embodiment, block layer 125 is composed of a single layer, but the inventive concept is not limited thereto. For example, block layer 125 may be a stack of a silicon oxide and an aluminum oxide.

Information storage pattern 123a and block layer 125 shown in FIG. 4 are provided for illustration, and could be variously reconfigured in alternative embodiments. For example, information storage pattern 123a and block layer 125 could alternatively be disposed along the length of channel patterns 123b.

Channel patterns 123b may be spaced apart from each other in first direction D1 and third direction D3. That is to say, channel patterns 123b may be arranged in a matrix configuration. In FIG. 4, channel patterns 123b are arranged in a 3×3 matrix, although the inventive concept is not limited thereto. Spaces may be formed in interlayer insulating layers 124 between channel patterns 123b arranged in third direction D3.

A drain region 127 is provided on channel patterns 123b. Bit lines 128a to 128c are connected to the channel patterns 123b through drain region 127. Channel patterns 123b arranged in third direction D3 are electrically connected to each other by bit lines 128a to 128c.

Figure 5:
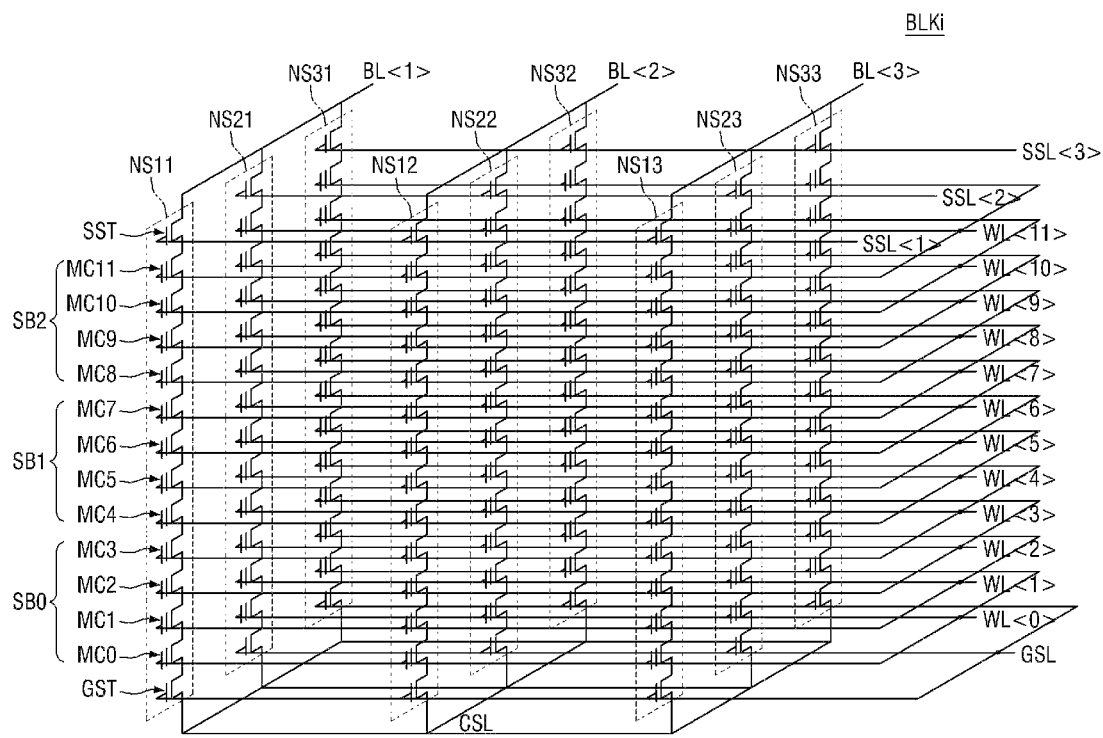
FIG. 5 is a circuit diagram illustrating memory blocks shown in FIG. 3, according to an embodiment of the inventive concept.

FIG. 5 is an circuit diagram illustrating the memory blocks shown in FIG. 3.

Referring to FIG. 5, cell strings NS11 to NS 33 are formed between bit lines BL<1>, BL<2> and BL<3> and a common source line CSL.

Specifically, cell strings NS11, NS21 and NS31 are formed between the first bit line BL<1> and common source line CSL. Cell strings NS12, NS22 and NS32 are formed between second bit line BL<2> and common source line CSL. Cell strings NS13, NS23 and NS33 are formed between third bit line BL<3> and common source line CSL. First to third bit lines BL<1> to BL<3> correspond to bit lines 128a to 128c shown in FIG. 4, respectively.

A string select transistor SST of cell string NS is connected to the corresponding bit line BL. A ground select transistor GST of cell string NS is connected to common source line CSL. Memory cells MC0 to MC11 are provided between the string select transistor SST and ground select transistor GST of cell strings NSs.

In the following description, cell strings NSs are divided into units of rows and columns Cell strings NSs commonly connected to one bit line constitute a column. For example, cell strings NS11 to NS31 connected to first bit line BL<1> may correspond to a first column. Cell strings NS12 to NS32 connected to the second bit line BL<2> may correspond to a second column. Cell strings NS13 to NS 33 connected to third bit line BL<3> may correspond to a third column.

Cell strings NSs connected to one string select line SSL constitute a row. For example, cell strings cell strings NS11 to NS13 connected to first string select line SSL<1> may correspond to a first row. Cell strings NS21 to NS23 connected to second string select line SSL<2> may correspond to a second row. Cell strings NS31 to NS33 connected to third string select line SSL<3> may correspond to a third row.

Each of cell strings NSs comprises a ground select transistor GST. Ground select transistors GSTs are controlled by a single ground select line GSL. Although not illustrated, the cell strings corresponding to the respective rows may also be controlled by different ground select lines.

Memory cells MCs corresponding to the same semiconductor layer share a word line WL. A memory cell MC0 of each of cell strings NS11 to NS33 is connected to word line WL<0>. In addition, cell strings NS of the same row share string select line SSL. Cell strings NS of different rows are connected to different string select lines SSL<1>, SSL<2> and SSL<3>, respectively. Common source line CSL is commonly connected to cell strings NSs. For example, the doped regions 122 shown in FIG. 4 may be connected to each other to constitute common source line CSL.

A selected memory block BLKi among memory blocks BLK0 to BLKi may be divided into a number of sub-blocks SB0, SB1 and SB2 smaller than the memory blocks. Sub-blocks SB0, SB1 and SB2 may be divided in a word line direction. Each sub-block should be erased in memory block BLKi independently of the other sub-blocks, irrespective of on which basis the sub-blocks are divided.

As an example, sub-block SB0 may comprise memory cells connected to word lines WL<0>, WL<1>, WL<2>, WL<3>, among the memory cells included in memory block BLKi. Sub-block SB1 comprises memory cells connected to word lines WL<4>, WL<5>, WL<6> and WL<7>, among the memory cells included in memory block BLKi. Sub-block SB2 comprises memory cells connected to word lines WL<8>, WL<9>, WL<10> and WL<11>, among the memory cells included in memory block BLKi. Memory cells included in sub-block SB0 may be selected independently of the other sub-blocks SB1 and SB2 to then be erased. That is to say, one or two or more of the sub-blocks SB0, SB1 and SB2 may be concurrently selected and erased. To this end, flash memory 120 should be able to supply a bias for erasing the memory cells in units of sub-blocks SBs.

Although FIG. 5 illustrates a method of dividing sub-blocks defined in one memory block BLKi, the inventive concept is not limited to the illustrated division of sub-blocks. For instance, although FIG. 5 shows one memory block BLKi divided into three sub-blocks, the memory block could alternatively be divided into two or more than four sub-blocks. In addition, one sub-block SB may include two or three word lines. Alternatively, one sub-block SB may include five or more word lines.

Meanwhile, although not illustrated, memory block BLKi may be divided into a number of pages smaller than the sub-blocks SB0, SB1 and SB2. The respective pages may be divided in a word line direction, and each page may be erased in memory block BLKi independently of the other pages.

As an example, each page may include memory cells connected to the same word line among the memory cells included in memory block BLKi. The memory cells in each page may be selected independently of the other pages to then be erased. For example, one or two or more of the pages may be concurrently selected and erased. To this end, flash memory 120 should be able to supply a bias for erasing the memory cells in units of pages.

Figure 6:
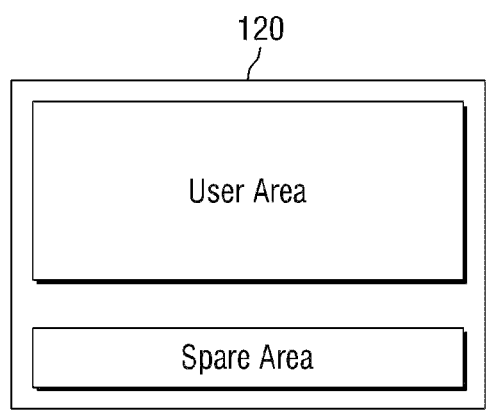
FIG. 6 is a diagram illustrating a flash memory of a memory system, according to an embodiment of the inventive concept.

FIG. 6 is a diagram illustrating a configuration of a flash memory of a memory system according to an embodiment of the inventive concept.

Referring to FIG. 6, a storage space of flash memory 120 is divided into a first area and a second area. As an example, the first area may be a user area, and the second area may be a spare area.

User data may be stored in the user area, and management information of the user area may be stored in the spare area. For example, bad block indicator information, an ECC, and metadata of pages may be stored in the spare area, but the inventive concept is not limited thereto. Here, the metadata represents page management information. In the following description, the metadata representing page management information will be referred to in brief as "metadata" to distinguish it from user data. As an example, the user area and the spare area may be divided in units of one page. As another example, the user area and the spare area may be divided into units of blocks. As still another example, the user area and the spare area may exist together in the storage space of flash memory 120. Alternatively, the bad block indicator information, the ECC, the metadata of pages, or the like, may be stored in memory module 113 of controller 110.

Although not illustrated, flash memory 120 may further comprise well-known components for accessing the memory array, for example, a row decoder circuit, a read/write circuit, a control logic, a voltage generator, a column decoder circuit, an input/output interface, and so on.

In a VNAND using CTF cells, an erase time may be prolonged. For example, an erase time required to erase one block may be prolonged to 15 ms or greater in the VNAND, compared to 1.5 ms in the planar NAND flash memory. The erase time may constitute overhead for the FTL that manages flash memory 120. As an example, if a predetermined page is copied to a free block, for example, in garbage collection, a time of 15 ms or greater may be required, including a time required for allocating the free block.

In memory system 1 according to the embodiment of the inventive concept, an erase operation may be performed by multiple steps. The multiple steps may comprise n steps. Flash memory 120 provides an erase command for each of the multiple steps, and the FTL uses each erase command in a free time, thereby managing the erase time. Each erase command may comprise, for example, some loops of in system programming (ISP) of the erase operation.

Figure 7:
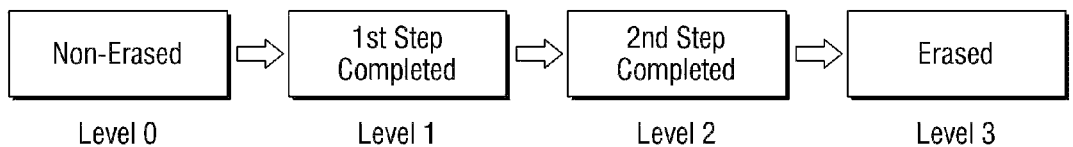
FIG. 7 is a flowchart illustrating an erase operation of a memory system, according to an embodiment of the inventive concept.
Figure 8:
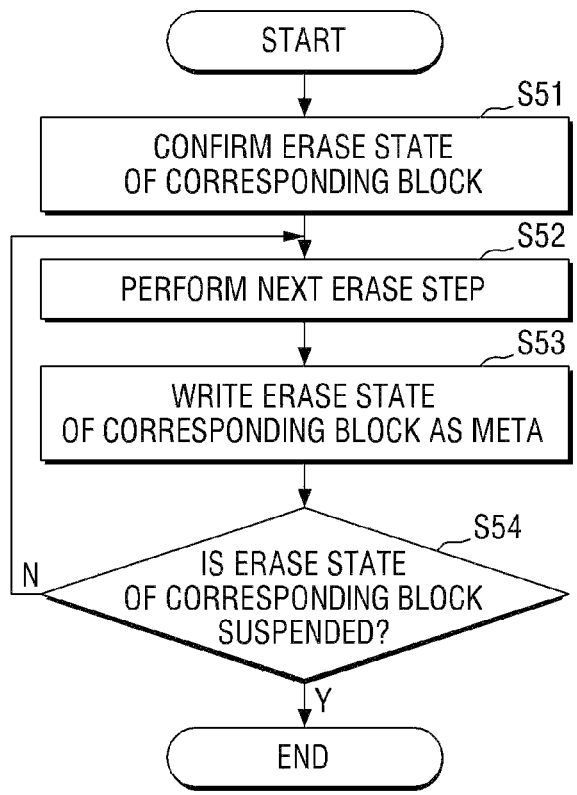
FIG. 8 is a flowchart illustrating an erase operation of a memory system, according to an embodiment of the inventive concept.

FIG. 7 is a flowchart illustrating an erase operation of a memory system, according to an embodiment of the inventive concept. FIG. 8 is a flowchart illustrating an erase operation of the memory system, according to an embodiment of the inventive concept.

Referring to FIG. 7, as an example, an erase operation of memory system 1 is performed in three steps, and flash memory 120 provides three erase commands for performing the erase operation. To completely erase blocks having data written thereto, the erase operation executes the three erase commands.

In a first step, controller 110 erases at least one block and then suspends the erase operation of the block. In each of second and third steps, controller 110 erases the at least one block again. Controller 110 performs erase operations of the second and third steps in substantially the same manner as the first step.

The respective blocks of flash memory 120 that are subject to the erase operation of FIG. 7 may be in one of three erasure states, and the blocks may be distinguished from each other according to their erasure states. For instance, a block may be in a non-erased state in which none of the three steps has been executed, in a first step completed state in which a first erase command has been executed, a second step completed state in which a second erase command has been executed, or an erasure state in which a third erase command has been executed.

Referring to FIG. 8, during an erase operation of a corresponding block, controller 110 identifies an erasure state of the corresponding block (S51). As described above, the erasure states of the corresponding block may be divided into the first step completed state, the second step completed state, and the erasure state. In addition, the corresponding block may be in a non-erased state. Controller 110 identifies the erasure state of the corresponding block based on metadata to be described later.

Next, controller 110 performs a next erase step according to the erasure state of the corresponding block (S52). As an example, where the corresponding block is in the non-erased state, controller 110 erases the corresponding block by the first step, where the corresponding block is in the first step completed state, it may be erased by the second step, and where the corresponding block is in the second step completed state, it may be erased by the third step.

Next, controller 110 writes the erasure state of the corresponding block as metadata (S53). Next, controller 110 determines whether to temporarily suspend an erase operation of the corresponding block (S54). Where the erase operation of the corresponding block is not to be suspended (S54=N), controller 110 repeatedly performs the procedure from step S52. That is to say, controller 110 performs a next erase step of the previous erase step. Otherwise, where the erase operation of the corresponding block is to be suspended (S54=Y), to resume the erase operation of the corresponding block, controller 110 first identifies the erasure state of the corresponding block, like in step S51, and then repeatedly performs the next erase step.

Referring again to FIG. 7, controller 110 determines reference numbers for each of the respective three steps and stores the reference numbers in memory module 113. These reference numbers are labeled "Level 0" through "Level 3". The reference numbers indicate a minimum number of memory blocks to be maintained in each state corresponding to the three steps. For instance, the reference number "Level 0" indicates a minimum number of memory blocks to be maintained in the non-erased state, the reference number "Level 1" indicates a minimum number of memory blocks to be maintained in the first step completed state, and so on.

The FTL independently manages extended free blocks according to erasure states of the respective blocks. In the following description, the term "extended free block" will denote any block in the first step completed state, the second step completed state, or the erasure state.

The FTL writes metadata to flash memory 120, the metadata indicating up to which one of the multiple steps an erase operation of the block has been completed. As described above, the FTL may write the metadata to memory module 113. The FTL performs an erase operation of each block based on the metadata written to flash memory 120.

Where the FTL writes the metadata to flash memory 120, write overhead may be generated. However, in certain embodiments of the inventive concept, the write overhead may be reduced according to the manner of performing garbage collection.

In general, garbage collection is a background operation performed for the FTL to generate a free block. In the garbage collection, a block is selected from the memory array, valid pages of the specific block are copied to a free block, and the selected block is erased to become a free block. The erased block may be used when data is to be later written.

In some systems, a flash memory writes metadata before and after performing the garbage collection, because states of a block are necessarily changed before and after performing garbage collection. However, in certain embodiments of the inventive concept, before performing garbage collection, the FTL determines whether the number of extended free blocks is smaller than a reference number, and performs at least one of the multiple steps according to the determination result, thereby performing an erase operation of at least one block.

Thereafter, the FTL updates and writes metadata according to the erasure state of each block of flash memory 120 using a time required for writing the metadata after completing the garbage collection, which will later be described in more detail with reference to FIGS. 9 to 11.

In memory system 1, because the erase operation is performed by multiple steps by firmware of controller 110, and the erasure state of each block is managed based on metadata, an erase time shown to the host can be hidden.

Referring again to FIG. 1, controller 110 and flash memory 120 may be integrated into one semiconductor device. As an example, controller 110 and flash memory 120 may be integrated into one semiconductor device to form a memory card. For example, controller 110 and flash memory 120 may be integrated into one semiconductor device to form a Multi Media Card (MMC, RS-MMC, MMCmicro), a Secure Digital card (SD, miniSD, microSD), a Universal Flash storage (UFS), a PC card (originally PCMCIA or PCMCIA card), a Compact Flash (CF) card, a Smart Media (SM) Card, a memory stick, and the like, but not limited thereto.

As another example, controller 110 and flash memory 120 may be integrated into one semiconductor device to form a Solid State Disk/Drive (SSD). The SSD comprises a storage device configured to store data in a semiconductor memory.

Meanwhile, memory system 1 may comprise or be incorporated in a computer, a portable computer, an ultra mobile personal computer (UMPC), a work station, a net-book, a personal digital assistant (PDA), a portable computer, a web tablet, a wireless phone, a mobile phone, a smart phone, an e-book, a portable multimedia player (PMP), a potable game console, a navigation device, a black box, a digital camera, a 3-dimensional television, a digital audio recorder, a digital audio player, a digital picture recorder, a digital picture player, digital video recorder, a digital video player, a device capable of transmitting/receiving information in wireless environments, one of various electronic devices constituting a home network, one of various electronic devices constituting a computer network, one of various electronic devices constituting a telematics network, RFID devices, or embedded systems, but not limited thereto.

Meanwhile, as an example, flash memory 120, storage device 100, or memory system 1 may be packaged in a variety of ways. For example, flash memory 120, a storage device 100, or memory system 1 may be mounted in a package on package (PoP), a ball grid array (BGA) package, a chip scale package (CSP), a plastic leaded chip carrier (PLCC), a plastic dual in-line package (PDIP), a die in waffle pack, a die in wafer form, a chip-on-board (COB), a ceramic dual in-line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi-chip package (MCP), a wafer-level fabricated package (WFP) or a wafer-level processed stack package (WSP).

Figure 9:
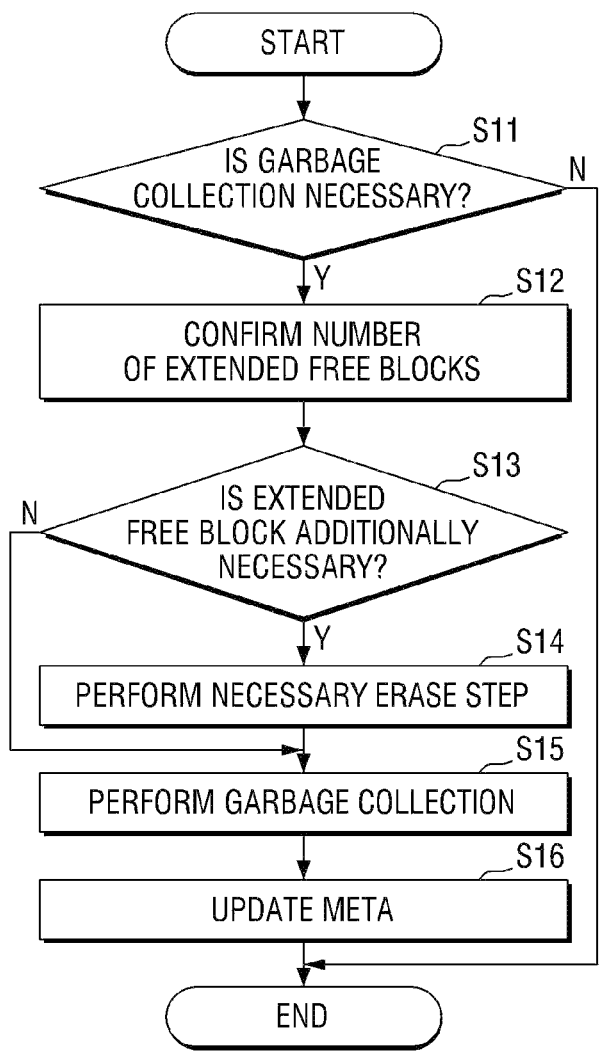
FIG. 9 is a flowchart illustrating a method of operating a memory system, according to an embodiment of the inventive concept.

FIG. 9 is a flowchart illustrating a method of operating a memory system, according to an embodiment of the inventive concept. The method of FIG. 9 and other figures will be described with reference to memory system 1 of FIG. 1, although these methods are not limited to being performed by this system.

Referring to FIG. 9, the FTL determines whether garbage collection is necessary (S11). Where a number of free blocks of flash memory 120 is less than or equal to a predetermined number (e.g., 1), the FTL may determine that garbage collection is necessary.

Next, if it is determined that garbage collection is necessary (S11=Y), the FTL identifies a number of extended free blocks (S12). For example, the FTL may identify how many blocks are in the first step completed state, the second step completed state, and the erasure state.

Next, the FTL determines whether additional extended free block is necessary (S13). For example, the FTL may determine whether the number of blocks being in each erasure state is smaller than a reference number. As an example, if the number of blocks being in the first step completed state is smaller than the reference number of Level 1, the FTL may determine that additional extended free block is necessary.

If it is determined that additional extended free block is necessary (S13=Y), the FTL may perform a necessary erase step (S14). The FTL performs the necessary erase step to make the number of blocks in each erasure state equal to the reference number. As an example, if the number of blocks in the first step completed state is smaller than the reference number Level 1, a target block among the blocks being in the non-erased state is selected, and a first step is performed on the selected block according to the first erase command. If it is not determined that additional extended free block is necessary (S13=N), the FTL proceeds to a step S15.

Next, the FTL performs garbage collection (S15). Then, the FTL updates and writes metadata (S16). As an example, the FTL updates the erasure state of the target block from a non-erased state to a first step completed state, and writes metadata indicating that the first erase step has been completed.

In the method of FIG. 9, the erasure state of each block of flash memory 120 is updated using a time of writing the metadata after completing garbage collection to then be written as metadata.

Figure 10:
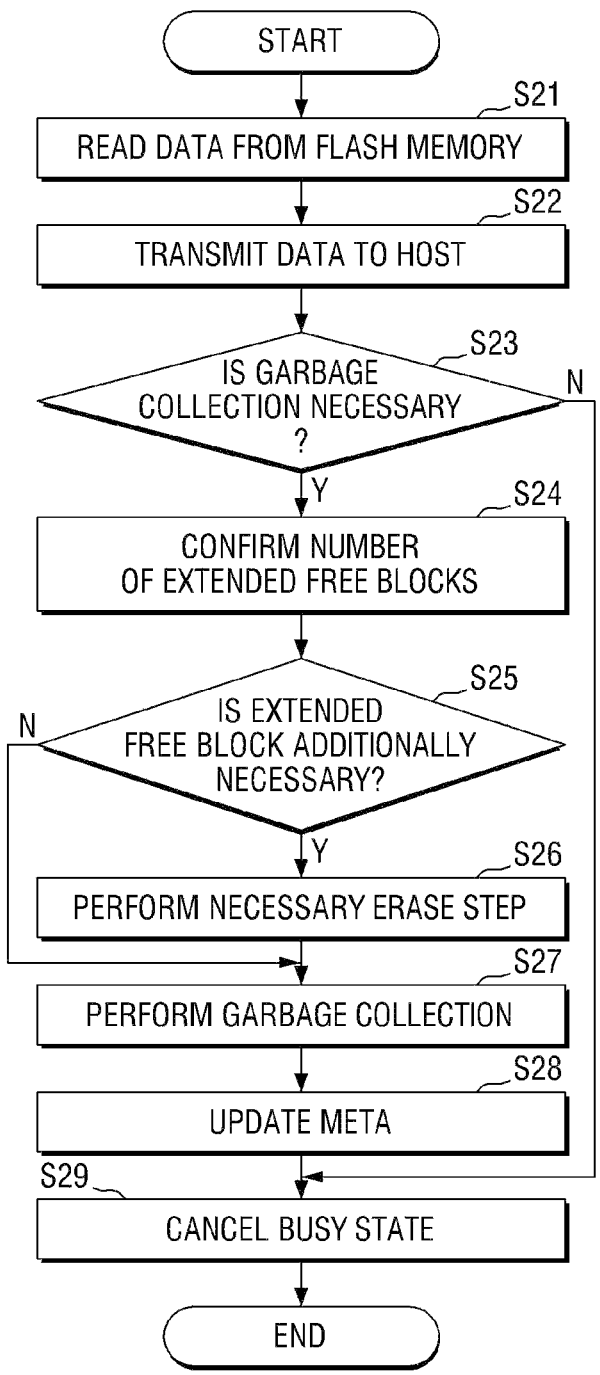
FIG. 10 is a flowchart illustrating a method of operating a memory system, according to an embodiment of the inventive concept.

FIG. 10 is a flowchart illustrating a method of operating a memory system according to another embodiment of the inventive concept. For the sake of convenience, the following description will focus on differences between the methods of FIGS. 9 and 10.

Referring to FIG. 10, controller 110 reads data from flash memory 120 upon request from the host (S21). As described above, controller 110 may set a state of flash memory 120 as a busy state and may transmit a busy signal to the host. Next, controller 110 transmits the data to the host (S22). Even after a read operation of flash memory 120 is completed, controller 110 does not cancel the busy state.

Figure 11:
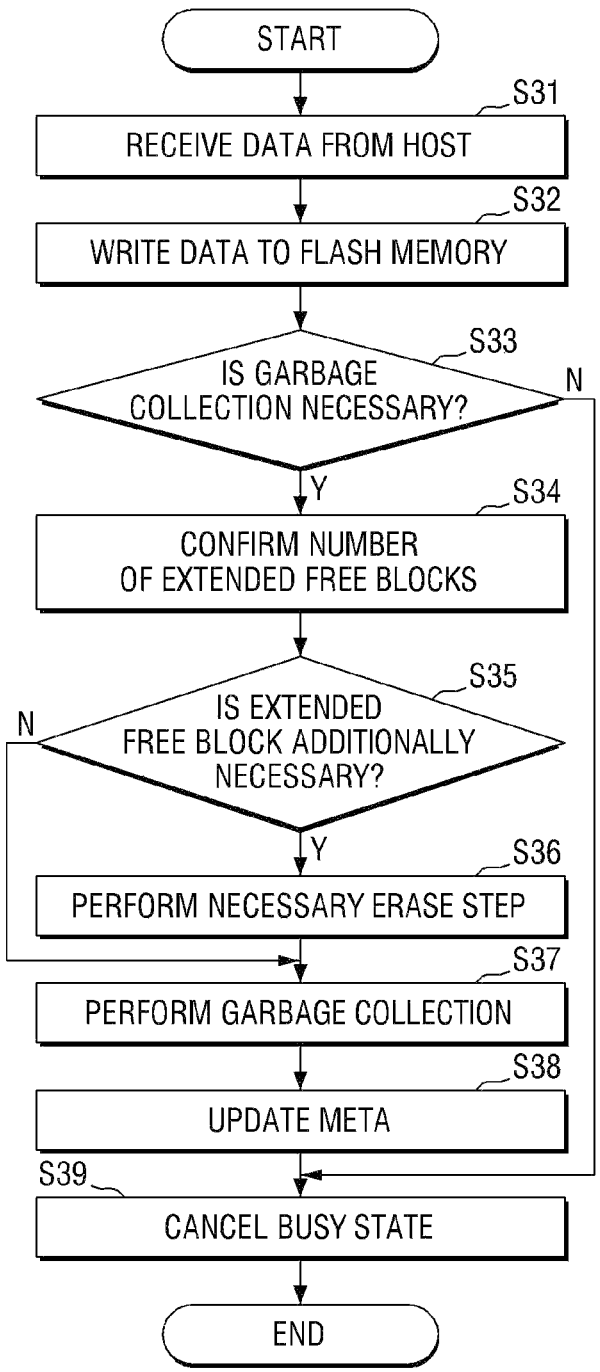
FIG. 11 is a flowchart illustrating a method of operating a memory system, according to an embodiment of the inventive concept.

Because steps S23 to S28 are substantially the same as steps S11 to S16 shown in FIG. 11, repeated explanations thereof will be omitted. After step S28, controller 110 cancels the busy state and transmits a ready signal to the host (S29).

In memory system 1, because controller 110 performs the erase operation by multiple steps while performing the read request from the host, an erase time shown to the host can be hidden.

FIG. 11 is a flowchart illustrating a method of operating a memory system according to still another embodiment of the inventive concept. For the sake of convenience, the following description will focus on differences between the operating methods shown in FIGS. 9 and 11.

Referring to FIG. 11, controller 110 receives the data from the host in a write request from the host (S31). As described above, controller 110 may set a state of flash memory 120 as a busy state and may transmit a busy signal to the host. Next, controller 110 writes the data to flash memory 120 (S32). Even after a write operation of flash memory 120 is completed, controller 110 does not cancel the busy state.

Steps S33 to S38 are substantially the same as steps S11 to S16 shown in FIG. 9, so repeated explanations thereof will be omitted. After step S38, controller 110 cancels the busy state and transmits a ready signal to the host (S39).

In memory system 1, because controller 110 performs the erase operation by multiple steps while performing the write request from the host, an erase time shown to the host can be hidden.

In embodiments illustrated in FIGS. 9 to 11, because the FTL writes metadata after performing garbage collection, the metadata may retain an updated erasure state of each block even after the power of flash memory 120 is turned off.

As described above, in the performing of the erase operation by the multiple steps, if it is necessary to perform garbage collection, the erase operation is performed before performing garbage collection. However, when the erase operation has been performed but the power of flash memory 120 is turned off before the garbage collection is completed, each block retains an erasure state as a state before performing the erase operation. This is because the FTL does not write metadata until garbage collection is completed. Accordingly, even after all steps of the erase operation of a specific block have been completed, the written metadata indicates that the erasure state of the specific block is a second step completed state. Alternatively, the written metadata may indicate that the erasure state of the specific block is a first step completed state or the non-erased state.

In memory system 1, controller 110 may determine whether a corresponding block is completely erased by performing an erase verify operation. Controller 110 performs the erase verify operation on the block having not completed all steps of the erase operation. As the result of the erase verify operation, the FTL may write the metadata to indicate that all steps of the erase operation of the block have been completed even if the block whose erasure state is not normally written is completely erased.

Figure 12:
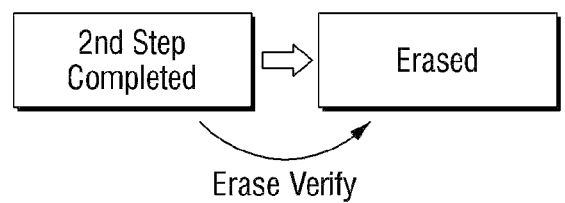
FIG. 12 is a flowchart illustrating an erase verify operation of a memory system, according to an embodiment of the inventive concept.

FIG. 12 illustrates an erase verify operation of a memory system, according to an embodiment of the inventive concept.

Referring to FIG. 12, a block in the second step completed state may be shifted to an erasure state through the erase verify operation of controller 110. Alternatively, as a result of controller 110 performing the erase verify operation, a specific block being in a first step completed state may be converted to an erasure state or a non-erased state.

The erase verify operation may be performed by supplying a verify voltage to sense data bits of a particular page of a memory cell. In addition, the erase verify operation may be performed by well known verifying methods, for example, a column scanning method, or the like.

Figure 13:
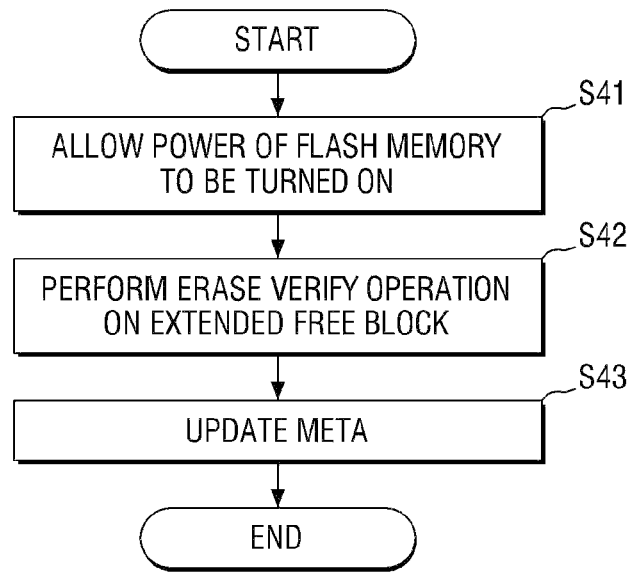
FIG. 13 is a flowchart illustrating a method of operating a memory system, according to an embodiment of the inventive concept.

FIG. 13 is a flowchart illustrating a method of operating a memory system, according to still another embodiment of the inventive concept.

Referring to FIG. 13, after being abnormally turned off, power is restored to flash memory 120 (S41). Next, controller 110 performs an erase verify operation on an extended free block (S42). Here, controller 110 may perform an erase verify operation on a block having not completed all steps of the erase operation, particularly, a block having completed a second step while not completing the last step.

Next, if an erase operation of a target block is completed, controller 110 updates metadata and writes the metadata to indicate that all steps have been completed even if the erasure state of the target block is not normally written (S43).

Figure 14:
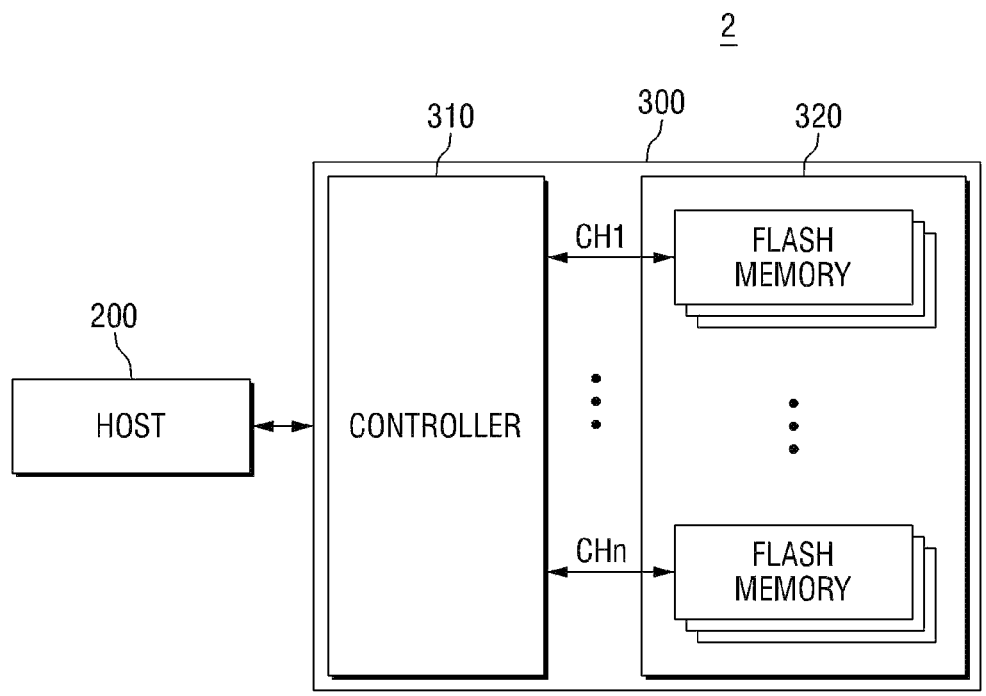
FIG. 14 is a block diagram illustrating an electronic system comprising a memory system, according to an embodiment of the inventive concept.

FIG. 14 is a block diagram illustrating an electronic system comprising a memory system, according to an embodiment of the inventive concept.

Referring to FIG. 14, memory system 2 comprises a storage device 300 and a host. Storage device 300 comprises multiple flash memory chips 320 each divided into multiple groups. Each group of the flash memory chips 320 is configured to communicate with a controller 310 through a common channel. For example, the flash memory chips 320 may communicate with controller 310 through first to kth channels CH1 to CHk. Each of flash memory chips 320 is configured in the same manner as flash memory 120 shown in FIGS. 1 to 5.

While the flash memory chips 320 connected to one channel are exemplified in FIG. 14, it can be understood by one skilled in the art that memory system 2 may be modified to connect one flash memory chip to one channel.

In the embodiment of FIG. 14, the block-based erase operation of the flash memory has been described by way of example. However, as shown FIG. 5, it would be appreciated by those skilled in the art that a sub-block based erase operation or a page based erase operation is performed on the flash memory in substantially the same manner as the block-based erase operation.

Figure 15:
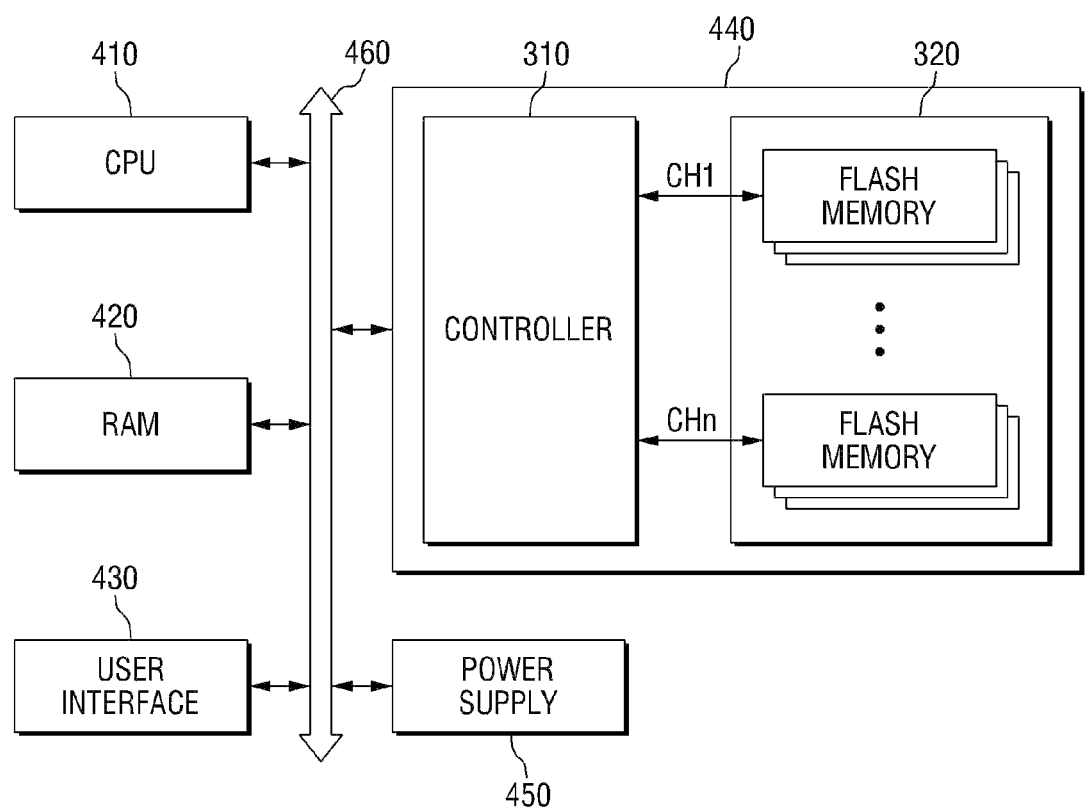
FIG. 15 is a block diagram illustrating a computing system comprising the memory system shown in FIG. 14, according to an embodiment of the inventive concept.

FIG. 15 is a block diagram illustrating a computing system 3 comprising the memory system shown in FIG. 14, according to an embodiment of the inventive concept.

Referring to FIG. 15, computing system 3 comprises a central processing unit (CPU) 410, a random access memory (RAM) 420, a user interface 430, a power supply 450, and a memory system 440.

Memory system 440 may be electrically connected to CPU 410, RAM 420, user interface 430 and power supply 450 through a system bus 460. The data supplied through user interface 430 or processed by CPU 410 may be stored in memory system 440.

In FIG. 15, multiple flash memories 320 are connected to system bus 460 through controller 310. However, unlike in FIG. 15, flash memories 320 may be configured to be directly connected to system bus 460.

Memory system 2 shown in FIG. 14 is provided in the computing system exemplified in FIG. 15. However, the memory system may be replaced with memory system 1 shown in FIG. 1. As an example, computing system 3 may be configured to both of the memory systems shown in FIGS. 1 and 14.

The foregoing is illustrative of embodiments and is not to be construed as limiting thereof. Although a few embodiments have been described, those skilled in the art will readily appreciate that many modifications are possible in the embodiments without materially departing from the scope of the inventive concept. Accordingly, all such modifications are intended to be included within the scope of the inventive concept as defined in the claims.

What is claimed is:

1. A memory system, comprising:
 a flash memory comprising multiple memory blocks; and
 a controller configured to erase each of the memory blocks using multiple steps,
 wherein the controller stores, for each of the memory blocks, metadata indicating which of the multiple steps have been completed, and erases each of the memory blocks based on the stored metadata,
 wherein the controller erases the memory blocks by different erase commands for each of the multiple steps, and
 wherein the flash memory is a vertical NAND flash memory comprising charge trapped flash (CTF) cells.

2. The memory system of claim 1, wherein the controller stores reference numbers respectively corresponding to the multiple steps, and if a number of memory blocks having completed a selected step among the multiple steps is smaller than a corresponding one of the reference numbers, erases a memory block using the selected step.

3. The memory system of claim 2, wherein the controller erases a memory block having completed up to a previous step among the multiple steps, using a next step among the multiple steps, and
 wherein the number of memory blocks having completed the next step is smaller than the reference number.

4. The memory system of claim 1, wherein the controller erases the multiple memory blocks using at least one of the multiple steps and then suspends the erase operation of the multiple memory blocks.

5. The memory system of claim 1, wherein the controller stores the metadata in the flash memory.

6. The memory system of claim 1, wherein, as a consequence of determining that garbage collection is to be performed, the controller erases a selected memory block using at least one of the multiple steps prior to performing the garbage collection.

7. The memory system of claim 6, wherein the controller updates the metadata and stores the updated metadata upon completing the garbage collection.

8. The memory system of claim 1, wherein after reading data from the flash memory and transmitting the read data to a host, the controller erases a memory block using at least one of the multiple steps and then cancels a busy state.

9. The memory system of claim 8, wherein after erasing the memory block using at least one of the multiple steps, the controller updates the metadata and stores the updated metadata and then cancels the busy state.

10. The memory system of claim 1, wherein after receiving data from a host and storing the data in the flash memory, the controller erases the memory block using at least one of the multiple steps and then cancels a busy state.

11. The memory system of claim 10, wherein after erasing the memory block using at least one of the multiple steps, the controller updates the metadata and stores the updated metadata and then cancels the busy state.

12. A memory system comprising:
 a flash memory comprising multiple memory blocks; and
 a controller configured to erase each of the memory blocks using multiple steps,
 wherein the controller erases the memory blocks by different erase commands for each of the multiple steps,
 wherein the controller stores, for each of the memory blocks, metadata indicating which of the multiple steps have been completed, performs an erase verify operation on a memory block indicated as not having completed a last one of the multiple steps, and as a consequence of the verify operation determining that the memory block is erased, stores metadata indicating that the memory block is in an erased state, and
 wherein the flash memory is a vertical NAND flash memory comprising charge trapped flash (CTF) cells.

13. The memory system of claim 12, wherein after power of the flash memory is turned on, the controller performs the erase verify operation on a memory block having not completed the last one of the multiple steps.

14. The memory system of claim 12, wherein the controller stores the metadata in the flash memory.

15. A method of operating a memory system comprising a flash memory having multiple memory blocks, and a controller configured to erase each of the memory blocks using multiple steps, the method comprising:
- the controller storing in the flash memory, metadata indicating for each of the memory blocks which of the multiple steps have been completed; and
- the controller erasing one or more of the memory blocks by different erase commands for each of the multiple steps based on the stored metadata,
- wherein the flash memory is a vertical NAND flash memory comprising charge trapped flash (CTF) cells.

16. The method of claim 15, further comprising:
- determining that garbage collection is to be performed; and
- as a consequence of determining that garbage collection is to be performed, the controller erasing a selected memory block using at least one of the multiple steps prior to performing the garbage collection.

17. The method of claim 15, further comprising:
- storing respective reference numbers corresponding to the multiple steps;
- determining whether a number of memory blocks having completed a selected step among the multiple steps is smaller than a corresponding one of the reference numbers; and
- as a consequence of determining that the number of memory blocks having completed the selected steps is smaller than the corresponding one of the reference numbers, erasing a memory block using the selected step.

18. The method of claim 17, further comprising the controller erasing a memory block having completed up to a previous step among the multiple steps, using a next step among the multiple steps, wherein a number of memory blocks having completed the next step is smaller than a corresponding one of the reference numbers.

\* \* \* \* \*